US008981828B2

(12) United States Patent  
Jang et al.

(10) Patent No.: US 8,981,828 B2  
(45) Date of Patent: Mar. 17, 2015

(54) MULTI-PHASE GENERATOR

(71) Applicant: Samsung Electronics Co., Ltd., Suwon-si (KR)

(72) Inventors: Tae Kwang Jang, Hwaseong-si (KR); Jen Lung Liu, Seoul (KR); Nan Xing, Seoul (KR); Jae Jin Park, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/199,139

(22) Filed: Mar. 6, 2014

(65) Prior Publication Data  
US 2014/0266371 A1    Sep. 18, 2014

(30) Foreign Application Priority Data

Mar. 15, 2013  (KR) .......................... 10-2013-0027767

(51) Int. Cl.  
*H03H 11/16*    (2006.01)  
*H03K 5/15*    (2006.01)

(52) U.S. Cl.  
CPC ........................................ *H03K 5/15* (2013.01)  
USPC ........................................... 327/258; 327/284

(58) Field of Classification Search  
None  
See application file for complete search history.

(56) References Cited

U.S. PATENT DOCUMENTS

| 6,426,662 | B1 * | 7/2002 | Arcus ........................... 327/295 |
| 6,777,994 | B2 | 8/2004 | Chou et al. |
| 6,833,691 | B2 * | 12/2004 | Chapuis ........................ 323/283 |
| 7,061,287 | B2 | 6/2006 | Jeon |
| 7,106,117 | B2 | 9/2006 | Jung et al. |
| 7,205,924 | B2 | 4/2007 | Vemulapalli et al. |
| 7,301,410 | B2 | 11/2007 | Rhee et al. |
| 7,990,191 | B2 | 8/2011 | Fujino et al. |
| 8,106,808 | B1 | 1/2012 | Cohen et al. |
| 8,120,397 | B2 | 2/2012 | Yun et al. |
| 8,164,493 | B2 | 4/2012 | Hsieh |
| 8,228,106 | B2 | 7/2012 | Baumann et al. |
| 2011/0260902 | A1 | 10/2011 | Lee et al. |
| 2011/0292265 | A1 | 12/2011 | Takahashi et al. |
| 2012/0038404 | A1 | 2/2012 | Yong |
| 2012/0086486 | A1 | 4/2012 | Na et al. |

\* cited by examiner

*Primary Examiner* — Cassandra Cox  
(74) *Attorney, Agent, or Firm* — Sughrue Mion, PLLC

(57) ABSTRACT

A multi-phase generator includes an oscillator unit including a plurality of first buffer units forming a single closed loop and a delay unit including a plurality of second buffer units respectively connected to a plurality of nodes, wherein each of the plurality of nodes is connected between two adjacent buffer units of the first buffer units. A phase of an output signal of a second buffer unit, among the second buffer units, lags behind a phase of an output signal of a first buffer unit, among the first buffer units.

18 Claims, 12 Drawing Sheets

MULTI-PHASE GENERATOR

CROSS-REFERENCE TO RELATED APPLICATIONS

This application claims priority from Korean Patent Application No. 10-2013-0027767 filed on Mar. 15, 2013, the disclosure of which is hereby incorporated by reference in its entirety.

BACKGROUND

Embodiments relate to a multi-phase generator. In particular, exemplary embodiments relate to a multi-phase generator for generating a signal having various phases.

Demand for high-picture quality, high resolution, multi-function, and high-speed semiconductor devices has increased. Further, semiconductor devices need various operating frequencies to drive internal circuits. In particular, when a semiconductor device performs a high-speed operation such as operational processing, an oscillator that operates at high speed is required to generate a high operating frequency. In addition, a large-size circuit is separately required in order to generate a signal having various operating frequencies or phases.

SUMMARY

According to an aspect of the exemplary embodiments, there is provided a multi-phase generator including an oscillator unit including a plurality of first buffer units forming a single closed loop and a delay unit including a plurality of second buffer units respectively connected to a plurality of nodes. Each of the plurality of nodes which is connected between two adjacent buffer first units of the first buffer units. A phase of an output signal of a second buffer unit, among the second buffer units, may lag behind a phase of an output signal of a first buffer unit, among the first buffer units.

The multi-phase generator may further include a first current source configured to supply a first current to the first buffer units and a second current source configured to supply a second current to the second buffer units.

A phase of an output signal of the second buffer units may be determined by the first current and the second current.

The first current may be larger than the second current.

Each of the first buffer units may include a plurality of P buffers connected in parallel and a phase of an output signal of each of the first buffer units may be determined by P, where P may be an integer of at least 2. Each of the second buffer units may include a plurality of K buffers connected in parallel and a phase of an output signal of each of the second buffer units may be determined by K, where K may be an integer of at least 2. Here, P may be greater than K.

Alternatively, the multi-phase generator may further include a plurality of first capacitor units respectively connected to the nodes and a plurality of second capacitor units respectively connected to output nodes of the second buffer units.

Each of the first capacitor units may include a plurality of M capacitors and a phase of an output signal of each of the first buffer units may be determined by M, where M may be an integer of at least 2. Each of the second capacitor units may include a plurality of L capacitors and a phase of an output signal of each of the second buffer units may be determined by L, where L may be an integer of at least 2. Here, M may be smaller than L.

According to another aspect of the exemplary embodiments, there is provided a multi-phase generator including a first buffer unit configured to be connected to a first node and output a first signal by delaying an input signal of the first node, a second buffer unit configured to be connected to the first buffer unit and output a second signal by delaying the first signal, and a third buffer unit configured to be connected to the first node and output a third signal by delaying the input signal. A phase of the third signal has a value between a phase of the first signal and a phase of the second signal.

The multi-phase generator may further include a first current source configured to supply a first current to the first buffer unit and the second buffer unit and a second current source configured to supply a second current to the third buffer unit.

The phase of the third signal may be determined by the first current and the second current.

Each of the first and second buffer units may include a plurality of P buffers connected in parallel and the phase of the second signal may be determined by P, where P may be an integer of at least 2. The third buffer unit may include a plurality of K buffers connected in parallel and the phase of the third signal may be determined by K, where K may be an integer of at least 2.

Alternatively, the multi-phase generator may further include a first capacitor unit connected to the first node and a second capacitor unit connected to an output node of the third buffer unit.

The first capacitor unit may include a plurality of M capacitors and the phase of the second signal may be determined by M, where M may be an integer of at least 2. The second capacitor unit may include a plurality of L capacitors and the phase of the third signal may be determined by L, where L may be an integer of at least 2.

According to yet another aspect of the exemplary embodiments, there is provided a method of a multi-phase generator including generating a first current in response to a current control voltage signal, generating a second current in response to the current control voltage signal, supplying the first current to a plurality of first buffer units, supplying the second current to a plurality of second buffer units, delaying an input signal by an amount corresponding to the first current and outputting a corresponding intermediate phase signal in each of the first buffer units, and delaying the corresponding intermediate phase signal from each of the first buffer units by an amount corresponding to the second current and outputting a corresponding phase output signal in each of the second buffer units.

BRIEF DESCRIPTION OF THE DRAWINGS

The above and other features and advantages of the inventive concept will become more apparent by describing in detail exemplary embodiments thereof with reference to the attached drawings in which.

DETAILED DESCRIPTION OF THE EXEMPLARY EMBODIMENTS

Figure 1:
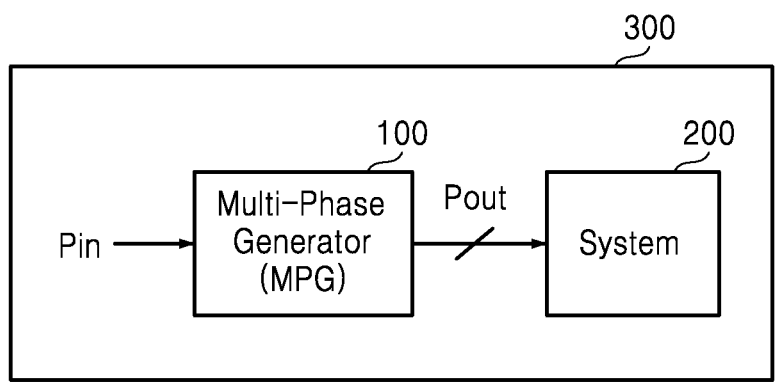
FIG. 1 is a diagram of a semiconductor device according to some embodiments.

Exemplary embodiments will be described more fully hereinafter with reference to the accompanying drawings, in which embodiments are shown. This exemplary embodiments may, however, be embodied in many different forms and should not be construed as limited to the embodiments set forth herein. Rather, these embodiments are provided so that this disclosure will be thorough and complete, and will fully convey the scope to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the exemplary embodiments belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a diagram of a semiconductor device 300 according to some embodiments. The semiconductor device 300 may be implemented as an electronic device or a portable device. The portable device may be a cellular phone, a smart phone, or a tablet personal computer (PC). The semiconductor device 300 may include a multi-phase generator (MPG) 100 and a system 200.

The MPG 100 may receive a phase control signal Pin (e.g., VCTRL in FIG. 2) and output at least one phase output signal Pout (e.g., Pout1 through Poutn in FIGS. 2, 5, and 6) corresponding to the phase control signal Pin. The at least one phase output signal Pout may all have a same frequency. The structure and operation of the MPG 100 will be described in detail with reference to FIGS. 2 through 6.

The system 200 may operate using the at least one phase output signal Pout. The system 200 may be a central processing unit (CPU), an application processor, a memory controller, a memory device, or an image sensor.

A timing generator (not shown) included in the system 200 may generate a plurality of control signals for driving the system 200 using the at least one phase output signal Pout. The MPG 100 may be implemented as the part of the timing generator or a phase locked loop (PLL) (not shown).

Figure 2:
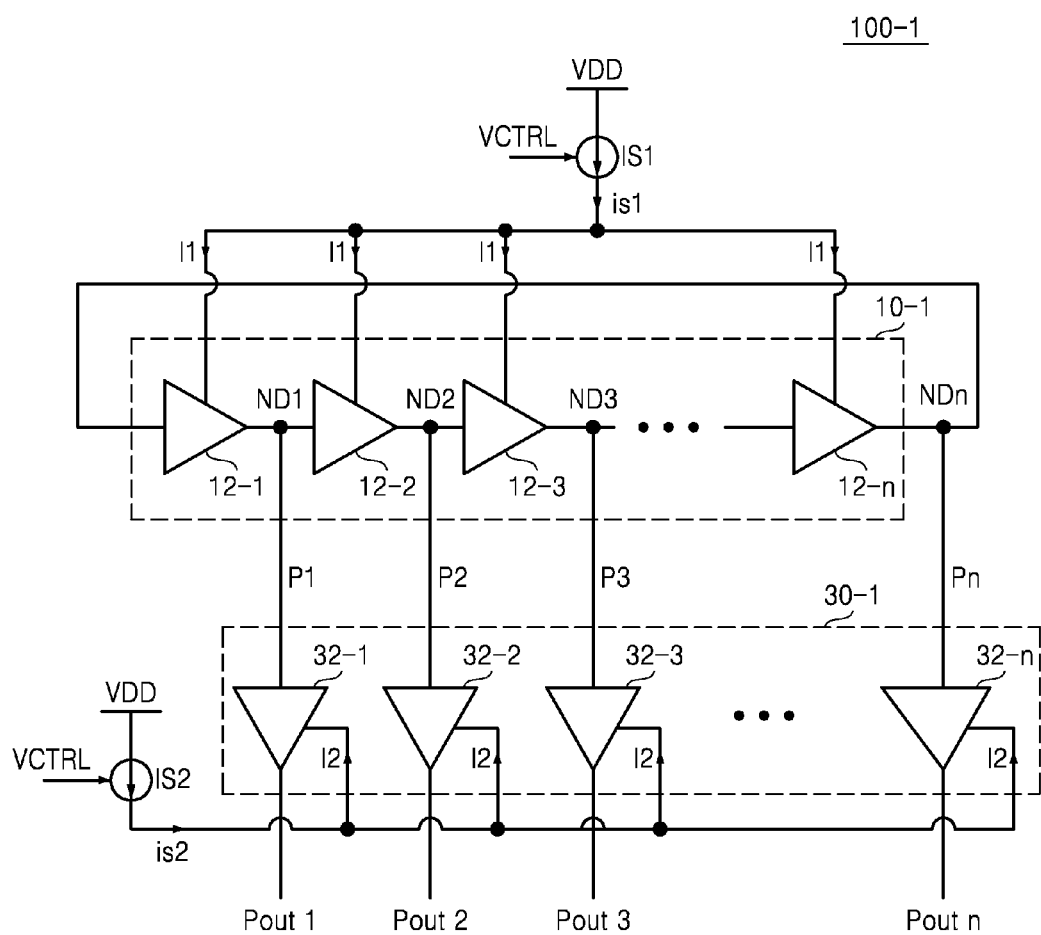
FIG. 2 is a diagram of an example of a multi-phase generator (MPG) illustrated in FIG. 1.

FIG. 2 is a diagram of an example 100-1 of the MPG 100 illustrated in FIG. 1. Referring to FIGS. 1 and 2, the MPG 100-1 may include a first current source IS1, a second current source IS2, an oscillator unit 10-1, and a delay unit 30-1.

The first current source IS1 may generate a predetermined current in response to a current control voltage signal VCTRL. The first current source IS1 may supply a first current I1 to a plurality of first buffer units 12-1 through 12-n in the oscillator unit 10-1, where "n" is an integer of at least 2.

The second current source IS2 may generate a predetermined current in response to the current control voltage signal VCTRL. The second current source IS2 may supply a second current I2 to a plurality of second buffer units 32-1 through 32-n in the delay unit 30-1.

The oscillator unit 10-1 may include the first buffer units 12-1 through 12-n forming a single closed loop. The oscillator unit 10-1 may be implemented as a differential delay chain oscillator or an inverter chain oscillator.

When the oscillator unit 10-1 is implemented as the differential delay chain oscillator, each of the first buffer units 12-1 through 12-n may be implemented as a differential amplifier and may have two inputs and two outputs. When the oscillator unit 10-1 is implemented as the inverter chain oscillator, each of the first buffer units 12-1 through 12-n may be implemented as an inverter and may have one input and one output. Each of the first buffer units 12-1 through 12-n may delay an input phase signal (e.g., an output signal P1 of the first buffer unit 12-1 output to a nodeND1 in case of the buffer unit 12-2) by an amount corresponding to the first current I1 and output a phase signal (e.g., P2 output to a node ND2).

The delay unit 30-1 may include the second buffer units 32-1 through 32-n respectively connected to a plurality of nodes ND1 through NDn each of which is between two adjacent buffer units among the first buffer units 12-1 through 12-n. The second buffer units 32-1 through 32-n may respectively receive phase signals P1 through Pn respectively output from the first buffer units 12-1 through 12-n to the nodes ND1 through NDn. The second buffer units 32-1 through 32-n may respectively delay the phase signals P1 through Pn by an amount corresponding to the second current I2 and respectively output the phase output signals Pout1 through Poutn. The second buffer units 32-1 through 32-n may be implemented as replica cells of the first buffer units 12-1 through 12-n.

Although not shown, the delay unit 30-1 may also include a plurality of i-th buffer units respectively connected to the node ND1 through NDn and output phase output signals by delaying the phase signals P1 through Pn by an amount corresponding to an i-th current of an i-th current source.

Figure 3:
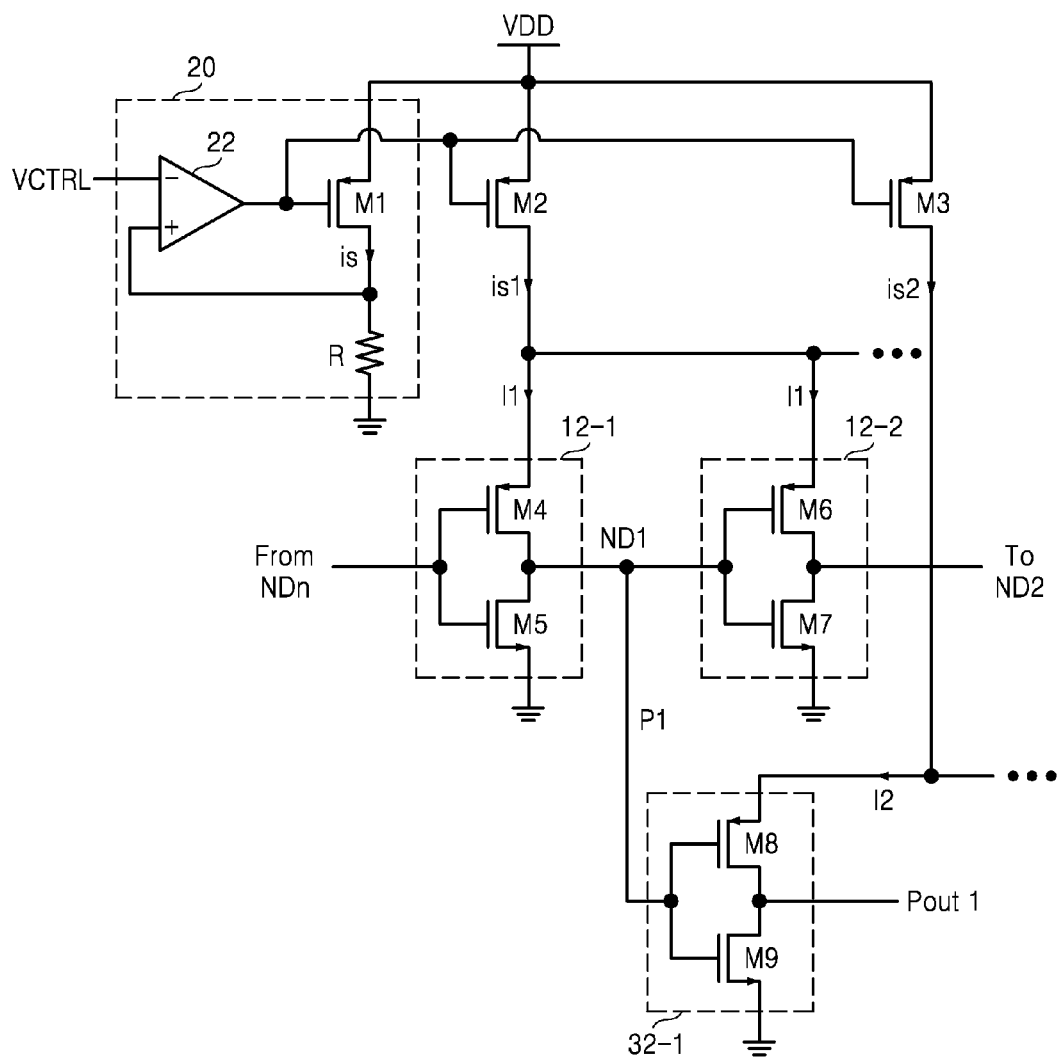
FIG. 3 is a diagram illustrating the part of the MPG to explain the operation of the MPG illustrated in FIG. 2.

FIG. 3 is a diagram illustrating a part 120 of the MPG 100-1 to explain the operation of the MPG 100-1 illustrated in FIG. 2. The part 120 of the MPG 100-1 may include a bias circuit 20, a second transistor M2, a third transistor M3, the first buffer units 12-1 and 12-2, and the second buffer unit 32-1. The bias circuit 20 and the second transistor M2 may form the first current source IS1. The bias circuit 20 and the third transistor M3 may form the second current source IS2.

The bias circuit 20 may include an amplifier 22, a first transistor M1, and a resistor R. The amplifier 22 receives the current control voltage signal VCTRL through an inverting input terminal and is connected to a node, in which the first transistor M1 and the resistor R are connected, through a non-inverting input terminal. The amplifier 22 may be connected to gates of the respective first through third transistors M1 through M3, and reliably apply the current control voltage signal VCTRL. The first transistor M1 may be connected between a supply voltage VDD and the node and generate a reference current "is" corresponding to the current control voltage signal VCTRL. The reference current "is" flows to a ground through the resistor R.

The second transistor M2 may be connected between the supply voltage VDD and the first buffer units 12-1 through 12-n and may supply a first supply current is 1 corresponding to the current control voltage signal VCTRL, so that the first buffer units 12-1 through 12-n are supplied with the first current I1. The third transistor M3 may be connected between the supply voltage VDD and the second buffer units 32-1 through 32-n and may supply a second supply current is 2 corresponding to the current control voltage signal VCTRL, so that the second buffer units 32-1 through 32-n are supplied with the second current I2.

The current flowing in each of the first through third transistors M1 and M3 depends on a ratio of a channel width W to a channel length L (hereinafter, referred to as a "W/L ratio") of a corresponding one transistor of the first through third transistors M1 and M3. For instance, when the W/L ratio of the second transistor M2 is triple the W/L ratio of the first transistor M1, the first supply current is 1 is three times as large as the reference current "is". When the W/L ratio of the third transistor M3 is double the W/L ratio of the first transistor M1, the second supply current is 2 is twice as large as the reference current "is". At this time, the second supply current is 2 is ⅔ times as large as the first supply current is 1.

FIG. 3 shows embodiments of the first current source IS1 and the second current source IS2. However, the scope of the exemplary embodiments is not restricted to these embodiments. It is assumed that each of the first buffer units 12-1 and 12-2 and the second buffer unit 32-1 is implemented as an inverter in the embodiments of FIG. 3.

The first buffer unit 12-1 may include a fourth transistor M4 and a fifth transistor M5 whose gates are connected to each other and which are connected in series between the second transistor M2 and the ground. The fourth and fifth transistors M4 and M5 operate as inverters. The first buffer unit 12-1 may receive the n-th phase signal Pn from the n-th node NDn, and may output the first phase signal P1 whose phase lags behind the phase of the n-th phase signal Pn. A phase angle, in which the first phase signal P1 lags behind, has a value corresponding to the first current I1.

The first buffer unit 12-2 may include a sixth transistor M6 and a seventh transistor M7 whose gates are connected to each other and which are connected in series between the second transistor M2 and the ground. The sixth and seventh transistors M6 and M7 operate as inverters. The first buffer unit 12-2 may receive the first phase signal P1 from the first node ND1 and may output the second phase signal P2 whose phase lags behind the phase of the first phase signal P1. A phase angle by which the second phase signal P2 lags behind has a value corresponding to the first current I1.

The second buffer unit 32-1 may include a eighth transistor M8 and a ninth transistor M9 whose gates are connected in common to the first node ND1 and which are connected in series between the third transistor M3 and the ground. The eighth and ninth transistors M8 and M9 operate as inverters. The second buffer unit 32-1 may receive the first phase signal P1 from the first node ND1, and may output the first phase output signal Pout2 whose phase lags behind the phase of the first phase signal P1. A phase angle by which the first phase output signal Pout1 lags behind has a value corresponding to the second current I2.

As described above, the phase delay of the first buffer units 12-1 and 12-2 is determined by the first current I1 and the phase delay of the second buffer unit 32-1 is determined by the second current I2. When the current flowing in an inverter increases, the amount of delay by which the phase of a signal passing through the inverter is delayed decreases. Further, when the current flowing in the inverter decreases, the amount of delay by which the phase of the signal passing through the inverter is delayed increases.

For instance, when the second current I2 is ⅔ of the first current I1, a phase angle by which the first phase signal P1 is delayed by the first buffer unit 12-2 is ⅔ of a phase angle by which the first phase signal P1 is delayed by the second buffer unit 32-1. In other words, the phase of the first phase output signal Pout1 output from the second buffer unit 32-1 lags behind the second phase signal P2 output from the first buffer unit 12-2.

Therefore, the phase delay of the first buffer units 12-1 through 12-n may be controlled by adjusting the first current I1 and the phase delay of the second buffer units 32-1 through 32-n may be controlled by adjusting the second current I2. As a result, the phase of the phase output signals Pout1 through Poutn may be determined by the first current I1 and the second current I2.

According to the above-described embodiments, an MPG is allowed to generate a signal having a wanted phase by adjusting current supplied to buffers. In other words, the signal having the wanted phase is generated without a complex circuit for interpolation. Therefore, a chip size and power consumption can be reduced.

The first through fourth transistors M1 through M4, the sixth transistor M6, and the eighth transistor M8 may be implemented as N-channel metal-oxide semiconductor (NMOS) transistors. The fifth transistor M5, the seventh transistor M7, and the ninth transistor M9 may be implemented as P-channel MOS (PMOS) transistors.

Figure 4:
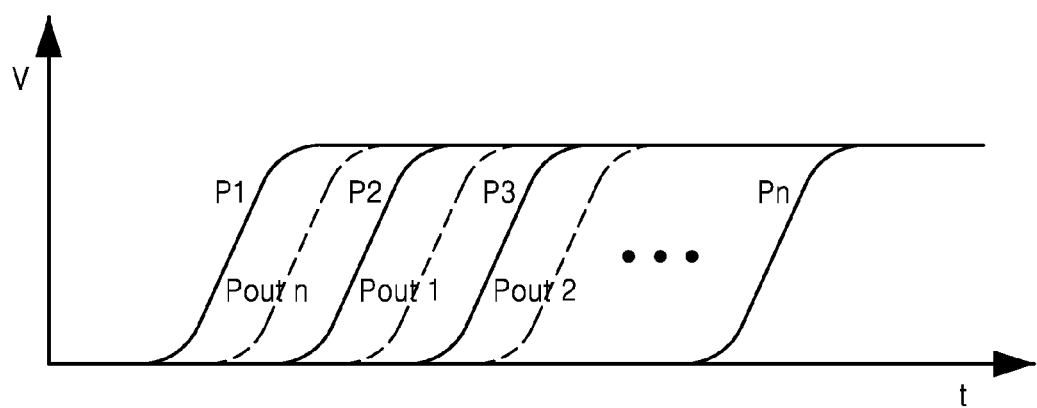
FIG. 4 is a graph for explaining the operation of the MPG illustrated in FIG. 2.

FIG. 4 is a graph for explaining the operation of the MPG 100-1 illustrated in FIG. 2. Referring to FIGS. 2 through 4, when the second current I2 is ⅔ of the first current I1, the phase of an output signal (e.g., Pout1) of each of the second buffer units 32-1 through 32-n respectively connected to the nodes ND1 through NDn lags behind the phase of an output signal (e.g., P2) of one of the first buffer units 12-1 through 12-n, which receives a signal of one of the corresponding nodes ND1 through NDn.

Figure 5:
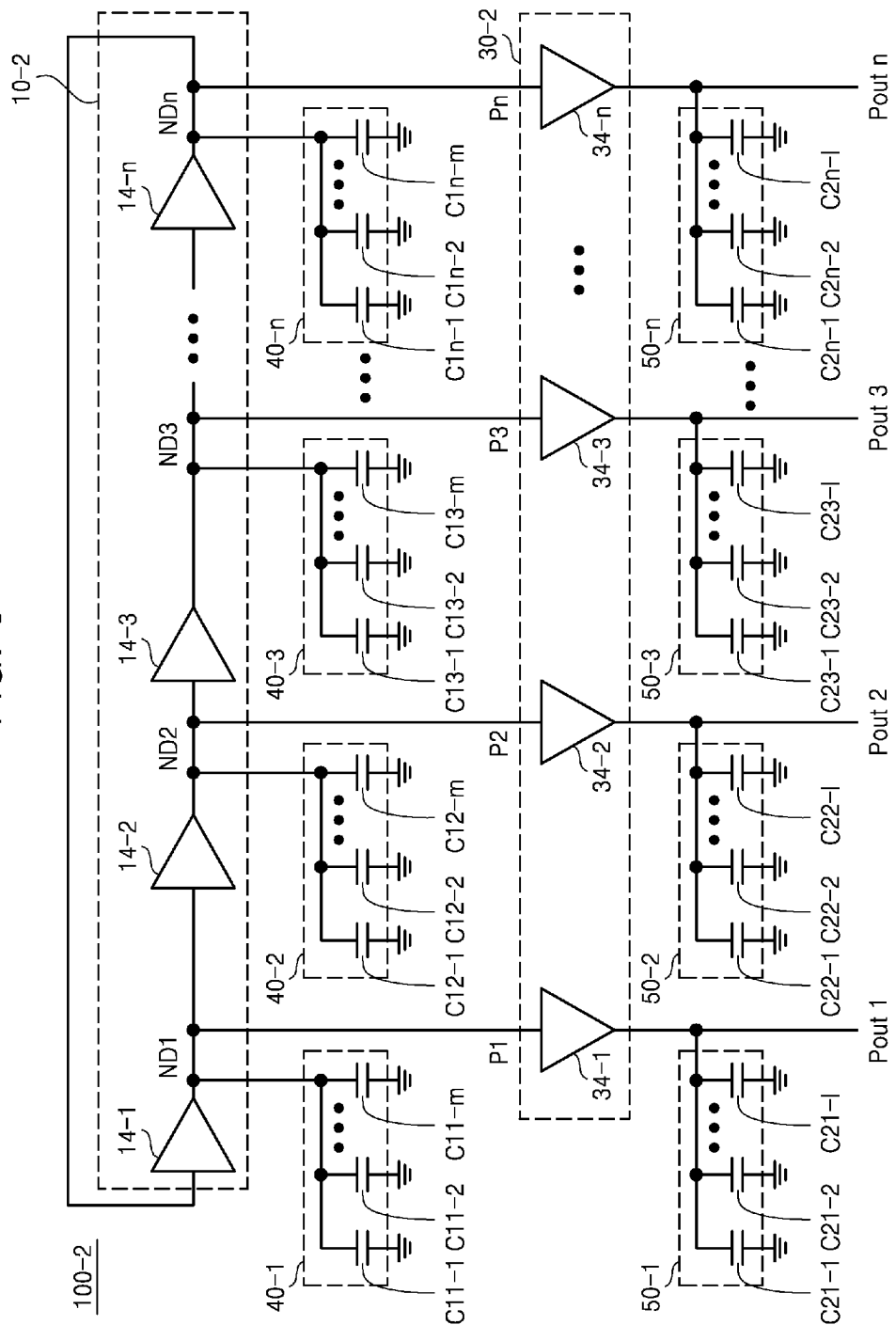
FIG. 5 is a diagram of another example of the MPG illustrated in FIG. 1.

FIG. 5 is a diagram of another example 100-2 of the MPG 100 illustrated in FIG. 1. Referring to FIGS. 1 through 5, the MPG 100-2 may include an oscillator unit 10-2, a delay unit 30-2, a plurality of first capacitor units 40-1 through 40-n, and a plurality of second capacitor units 50-1 through 50-n.

The oscillator unit 10-2 and the delay unit 30-2 are substantially the same as the oscillator unit 10-1 and the delay unit 30-1 illustrated in FIG. 2. Although not shown in FIG. 5, buffer units 14-1 through 14-n included in the oscillator unit 10-2 and buffer units 34-1 through 34-n included in the delay unit 30-2 may be supplied with current from a current source. The oscillator unit 10-2 and the delay unit 30-2 may be supplied with different currents (e.g., I1 and I2), respectively, as shown in FIG. 2.

Each of the first capacitor units 40-1 through 40-n includes "m" capacitors (e.g., C11-1 through C11-m) connected in parallel between one of the nodes ND1 through NDn and the ground, where "m" is an integer of at least 2. Since "m" capacitors are connected in parallel to each of the nodes ND1 through NDn, the phase delay of each of the first buffer units 14-1 through 14-n included in the oscillator unit 10-2 may depend on the number "m" of capacitors connected to one of the nodes ND1 through NDn, which is connected with an output terminal of corresponding one of the first buffer units 14-1 through 14-n. In other words, when the number "m" of capacitors increases, the phase delay of the first buffer units 14-1 through 14-n also increases. Further, when the number "m" of capacitors decreases, the phase delay of the first buffer units 14-1 through 14-n also decreases.

Each of the second capacitor units 50-1 through 50-n includes "l" capacitors (e.g., C21-1 through C21-l) connected in parallel between an output terminal of one of the second buffer units 34-1 through 34-n and the ground, where "l" is an integer of at least 2. Since "l" capacitors are connected in parallel to the output terminal of each of the second buffer units 34-1 through 34-n, the phase delay of each of the second buffer units 34-1 through 34-n included in the delay unit 30-2 may depend on the number "l" of capacitors connected to the output terminal of each of the second buffer units 34-1 through 34-n. In other words, when the number "l" of capacitors increases, the phase delay of the second buffer units 34-1 through 34-n also increases. Further, when the number "l" of capacitors decreases, the phase delay of the second buffer units 34-1 through 34-n also decreases.

When the number "m" of capacitors connected to the output terminal of each of the first buffer units 14-1 through 14-n is ⅔ of the number "l" of capacitors connected to the output terminal of each of the second buffer units 34-1 through 34-n, the relationship between the phase signals P1 through Pn and the phase output signals Pout1 through Poutn may be the same as shown in FIG. 4. Accordingly, the phase delay of the first buffer units 14-1 through 14-n and the phase delay of the second buffer units 34-1 through 34-n may be controlled by adjusting the numbers "m" and "l" of capacitors. Consequently, the phase of the phase output signals Pout1 through Poutn may be determined by the numbers "m" and "l" of capacitors.

As described above, an MPG according to the current embodiments is allowed to generate a signal having a wanted phase by adjusting the number of capacitors connected to an output terminal of a buffer.

Figure 6:
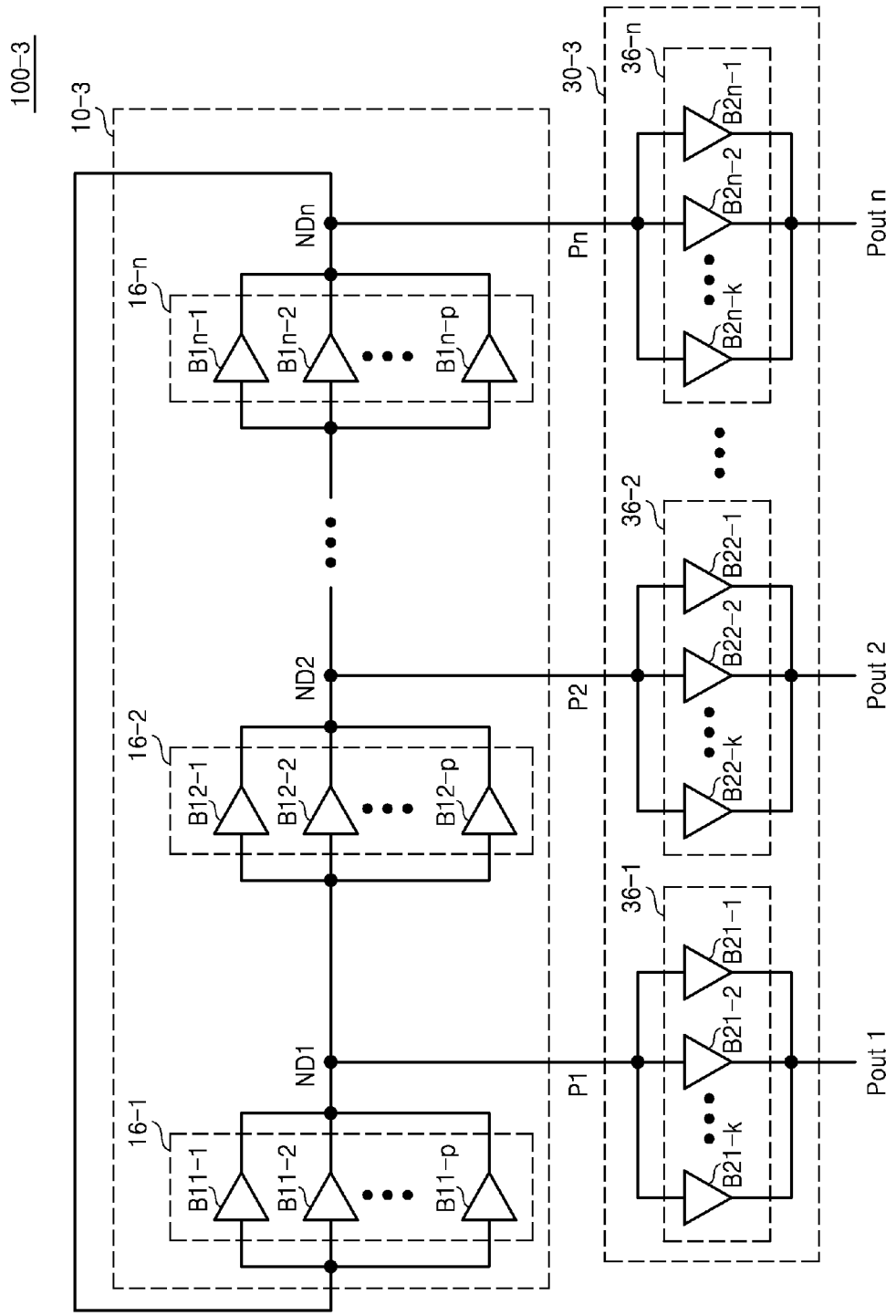
FIG. 6 is a diagram of another example of the MPG illustrated in FIG. 1.

FIG. 6 is a diagram of another example 100-3 of the MPG 100 illustrated in FIG. 1. Referring to FIGS. 1 through 4 and FIG. 6, the MPG 100-3 may include an oscillator unit 10-3 and a delay unit 30-3. Although not shown in FIG. 6, buffer units 16-1 through 16-n included in the oscillator unit 10-3 and buffer units 36-1 through 36-n included in the delay unit 30-3 may be supplied with current from a current source. The oscillator unit 10-3 and the delay unit 30-3 may be supplied with different currents (e.g., I1 and I2), respectively, as shown in FIG. 2.

The oscillator unit 10-3 includes the first buffer units 16-1 through 16-n, each of which includes "p" buffers (e.g., B11-1 through B11-p in the first buffer unit 16-1) connected in parallel, where "p" is an integer of at least 2. Since each of the first buffer units 16-1 through 16-n includes "p" buffers connected in parallel, the phase delay of the first buffer units 16-1 through 16-n included in the oscillator unit 10-3 may depend on the number "p" of buffers connected in parallel. In other words, when the number "p" of buffers increases, the phase delay of the first buffer units 16-1 through 16-n decreases. Further, when the number "p" of buffers decreases, the phase delay of the first buffer units 16-1 through 16-n increases.

The delay unit 30-3 includes the second buffer units 36-1 through 36-n, each of which includes "k" buffers (e.g., B21-1 through B21-k in the second buffer unit 36-1) connected in parallel, where "k" is an integer of at least 2. Since each of the second buffer units 36-1 through 36-n includes "k" buffers connected in parallel, the phase delay of the second buffer units 36-1 through 36-n included in the delay unit 30-3 may depend on the number "k" of buffers connected in parallel. In other words, when the number "k" of buffers increases, the phase delay of the second buffer units 36-1 through 36-n decreases. Further, when the number "k" of buffers decreases, the phase delay of the second buffer units 36-1 through 36-n increases.

When the number "k" of buffers included in each of the second buffer units 36-1 through 36-n is ⅔ of the number "p" of buffers included in each of the first buffer units 16-1 through 16-n, the relationship between the phase signals P1 through Pn and the phase output signals Pout1 through Poutn may be the same as shown in FIG. 4. Accordingly, the phase delay of the first buffer units 16-1 through 16-n and the phase delay of the second buffer units 36-1 through 36-n may be controlled by adjusting the numbers "p" and "k" of buffers. Consequently, the phase of the phase output signals Pout1 through Poutn may be determined by the numbers "p" and "k" of buffers.

As described above, an MPG according to the current embodiments is allowed to generate a signal having a wanted phase by adjusting the number of buffers included in a buffer unit.

Figure 7:
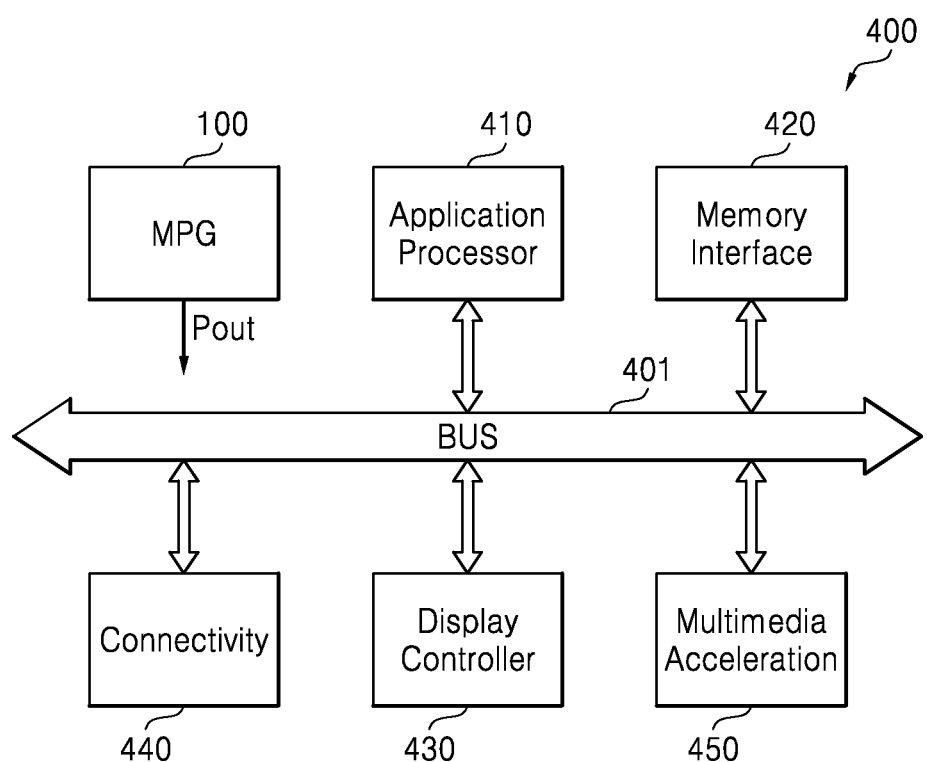
FIG. 7 is a block diagram of a portable electronic device including the MPG illustrated in FIG. 1 according to some embodiments.

FIG. 7 is a block diagram of a portable electronic device 400 including the MPG 100 illustrated in FIG. 1 according to some embodiments. Referring to FIGS. 1 through 7, the portable electronic device 400 includes the MPG100, an application processor 410, a memory interface 420, a display controller 430, connectivity 440, and multimedia acceleration 450. The portable electronic device 400 may be a laptop computer, a mobile telephone, a smart phone, a tablet personal computer (PC), a personal digital assistant (PDA), an enterprise digital assistant (EDA), a digital still camera, a digital video camera, a portable multimedia player (PMP), a personal navigation device or portable navigation device (PND), a handheld game console, or an e-book.

The MPG 100 may output the phase output signal Pout having a different phase in response to the phase control signal Pin. The MPG 100 may be implemented in the inside or outside of each of the application processor 410, the memory interface 420, the display controller 430, and the multimedia acceleration 450

The application processor 410 may control the memory interface 420, the display controller 430, the connectivity 440, and the multimedia acceleration 450 through a bus 401. The memory interface 420 may include an embedded memory device and also include a memory controller that interfaces with an external memory device.

The display controller 430 may transmit data to be displayed on a display to the display. The connectivity 440 may include general purpose input/output (GPIO) interface, a serial peripheral interface (SPI) bus, and/or a USB on-the-go (OTG). The multimedia acceleration 450 may include camera interface, multi-format codec, video pre/post processor, and/or Joint Photographic Experts Group (JPEG).

Figure 8:
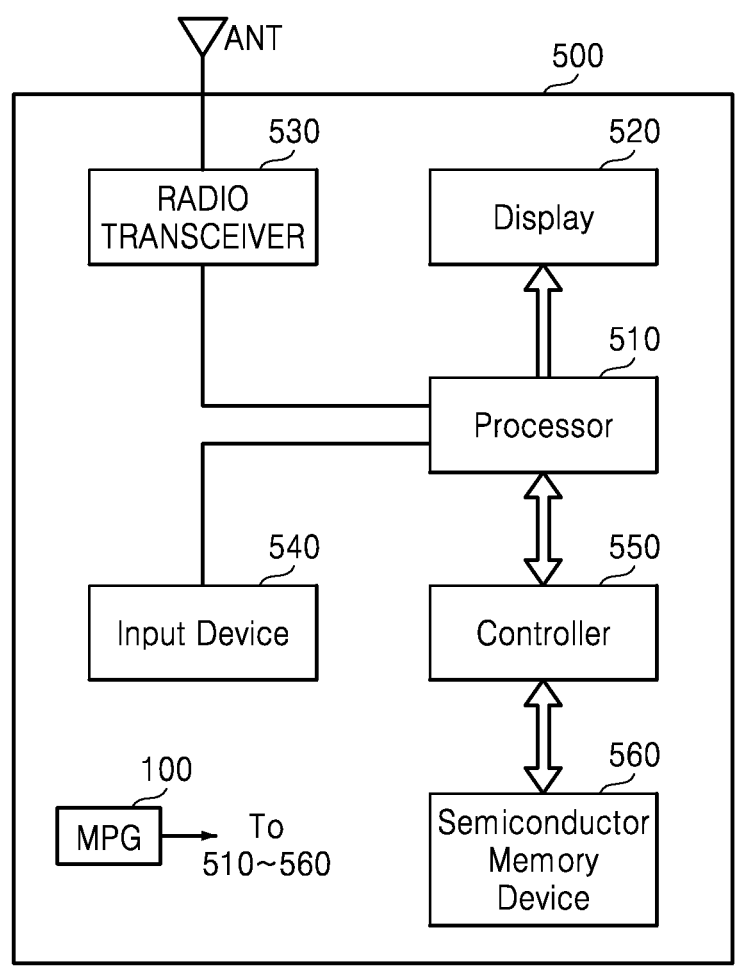
FIG. 8 is a block diagram of a semiconductor system including the MPG illustrated in FIG. 1 according to some embodiments.

FIG. 8 is a block diagram of a semiconductor system 500 including the MPG 100 illustrated in FIG. 1 according to some embodiments. Referring to FIGS. 1 and 8, FIG. 8 shows an example in which the MPG 100 illustrated in FIG. 1 is implemented in the semiconductor system 500. The semiconductor system 500 may be implemented as a cellular phone, a smart phone, a tablet PC, a PDA, or a radio communication system. The semiconductor system 500 includes the MPG 100, a processor 510, a display 520, a radio transceiver 530, an input device 540, a controller 550, and a semiconductor memory device 560.

The MPG 100 may output the phase output signal Pout having a different phase in response to the phase control signal Pin. The MPG 100 may be implemented in the inside or outside of each of the processor 510, the display 520, the radio transceiver 530, the input device 540, the controller 550, and the semiconductor memory device 560.

The controller 550 may control the data access operations, e.g., a program operation, an erase operation, and a read operation, of the semiconductor memory device 560 according to the control of the processor 510. The page data programmed in the semiconductor memory device 560 may be displayed through the display 520 according to the control of the processor 510 and/or the controller 550.

The radio transceiver 530 transmits or receives radio signals through an antenna ANT. The radio transceiver 530 may convert radio signals received through the antenna ANT into signals that can be processed by the processor 510. The processor 510 may process the signals output from the radio transceiver 530 and transmit the processed signals to the controller 550 or the display 520. The controller 550 may program the signals processed by the processor 510 to the semiconductor memory device 560. The radio transceiver 530 may also convert signals output from the processor 510 into radio signals and output the radio signals to an external device through the antenna ANT.

The input device 540 enables control signals for controlling the operation of the processor 510 or data to be processed by the processor 510 to be input to the semiconductor system 500. The input device 540 may be implemented as a pointing device such as a touch pad or a computer mouse, a keypad, or a keyboard.

The processor 510 may control the operation of the display 520 to display data output from the controller 550, data output from the radio transceiver 530, or data output from the input device 540. The controller 550, which controls the operations of the semiconductor memory device 560, may be implemented as a part of the processor 510 or as a separate chip.

Figure 9:
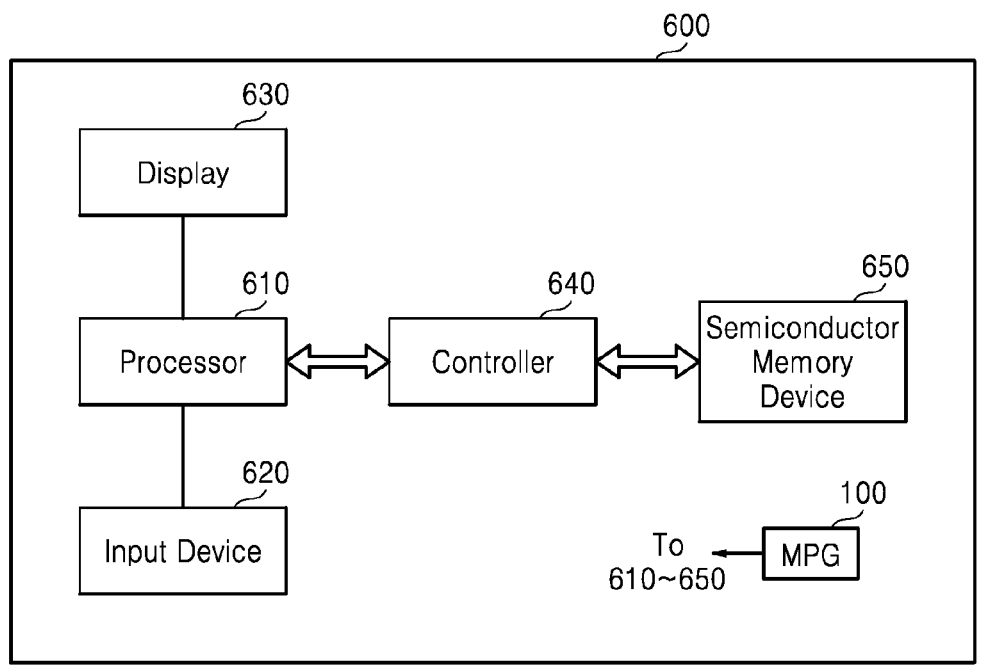
FIG. 9 is a block diagram of a semiconductor system including the MPG illustrated in FIG. 1 according to other embodiments.

FIG. 9 is a block diagram of a semiconductor system 600 including the MPG 100 illustrated in FIG. 1 according to other embodiments. Referring to FIGS. 1 and 9, the semiconductor system 600 may be implemented as a PC, a tablet PC, a netbook, an e-reader, a PDA, a PMP, an MP3 player, or an MP4 player. The semiconductor system 600 includes the MPG 100, a processor 610, an input device 620, a display 630, a controller 640, and a semiconductor memory device 650.

The MPG 100 may output the phase output signal Pout having a different phase in response to the phase control signal Pin. The MPG 100 may be implemented in the inside or outside of each of the processor 610, the input device 620, the display 630, the controller 640, and the semiconductor memory device 650.

The processor 610 may display data stored in the semiconductor memory device 650 through the display 630 according to data input through the input device 620. The input device 620 may be implemented as a pointing device such as a touch pad or a computer mouse, a keypad, or a keyboard.

The processor 610 may control the overall operation of the semiconductor system 600 and the operations of the controller 640. The controller 640, which may control the operations of the semiconductor memory device 650, may be implemented as a part of the processor 610 or as a separate chip.

Figure 10:
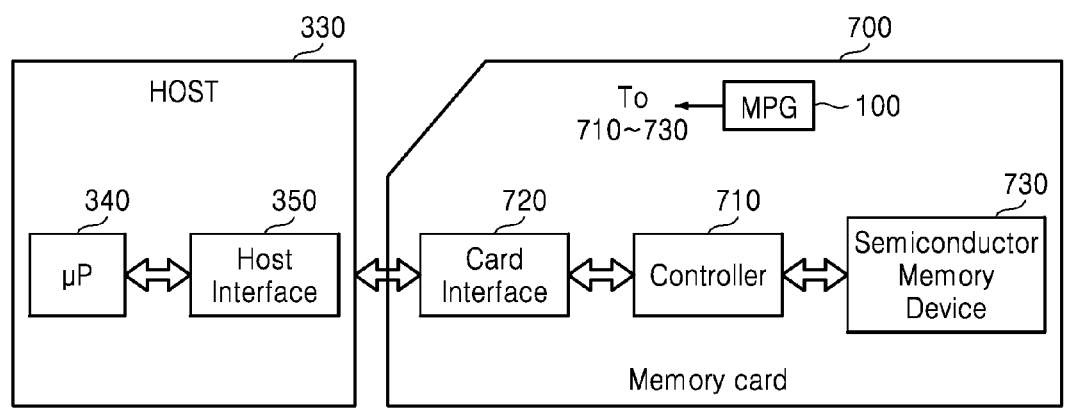
FIG. 10 is a block diagram of a semiconductor system including the MPG illustrated in FIG. 1 according to further embodiments.

FIG. 10 is a block diagram of a semiconductor system 700 including the MPG 100 illustrated in FIG. 1 according to further embodiments. Referring to FIGS. 1 and 10, the semiconductor system 700 may be implemented as a memory card or a smart card. The semiconductor system 700 includes the MPG 100, a controller 710, a card interface 720 and a semiconductor memory device 730.

The MPG 100 may output the phase output signal Pout having a different phase in response to the phase control signal Pin. The MPG 100 may be implemented in the inside or outside of each of the controller 710, the card interface 720, and the semiconductor memory device 730.

The controller 710 may control data exchange between the semiconductor memory device 730 and the card interface 720. The card interface 720 may be a secure digital (SD) card interface or a multi-media card (MMC) interface, but the exemplary embodiments are not restricted to the current embodiments.

The card interface 720 may interface a host 730 and the controller 710 for data exchange according to a protocol of the host 730. The card interface 720 may support a universal serial bus (USB) protocol and an interchip (IC)-USB protocol. Here, the card interface 720 may indicate a hardware supporting a protocol used by the host 730, a software installed in the hardware, or a signal transmission mode.

When the semiconductor system 700 is connected with a host interface 750 of the host 730 such as a PC, a tablet PC, a digital camera, a digital audio player, a cellular phone, a console video game hardware, or a digital set-top box, the host interface 750 may perform data communication with the semiconductor memory device 730 through the card interface 720 and the controller 710 according to the control of a microprocessor 740.

Figure 11:
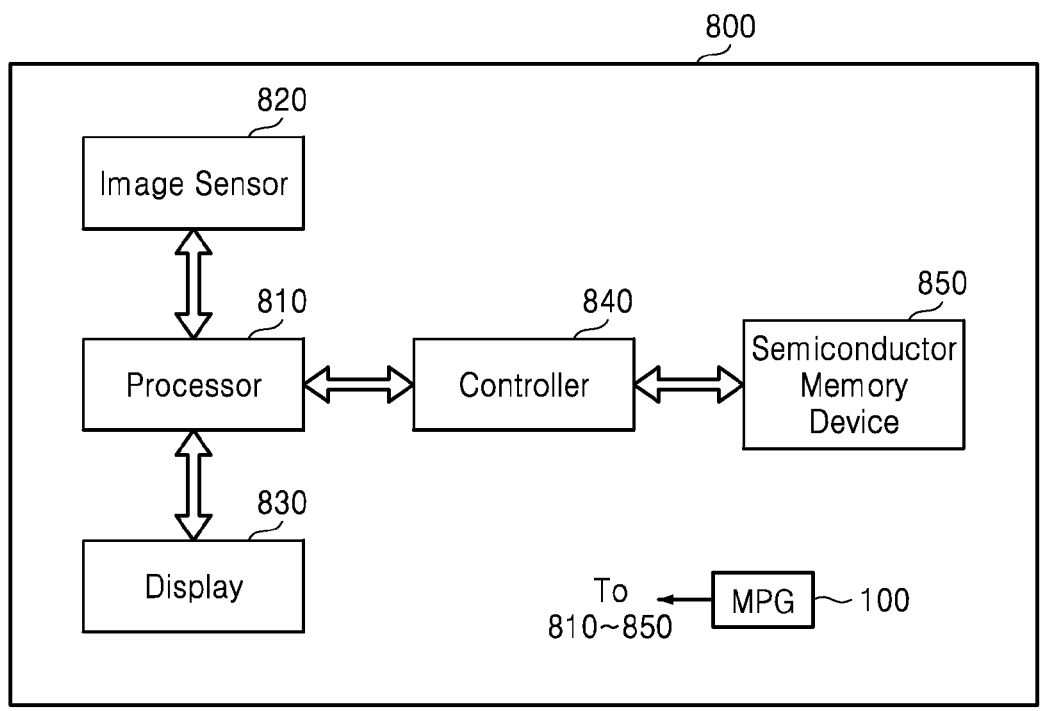
FIG. 11 is a block diagram of a semiconductor system including the MPG illustrated in FIG. 1 according to still other embodiments.

FIG. 11 is a block diagram of a semiconductor system 800 including the MPG 100 illustrated in FIG. 1 according to still other embodiments. Referring to FIGS. 1 and 11, the semiconductor system 800 may be implemented as an image processor such as a digital camera, a cellular phone equipped with a digital camera, a smart phone equipped with a digital camera, or a tablet PC equipped with a digital camera.

The semiconductor system 800 includes the MPG 100, a processor 810, an image sensor 820, a display 830, a controller 840 and a semiconductor memory device 850.

The MPG 100 may output the phase output signal Pout having a different phase in response to the phase control signal Pin. The MPG 100 may be implemented in the inside or outside of each of the processor 810, the image sensor 820, the display 830, the controller 840, and the semiconductor memory device 850.

The image sensor 820 converts optical images into digital signals and outputs the digital signals to the processor 810 or the controller 840. The digital signals may be controlled by the processor 810 to be displayed through a display 830 or stored in the semiconductor memory device 850 through the controller 840.

Data stored in the semiconductor memory device 850 may be displayed through the display 830 according to the control of the processor 810 or the controller 840. The controller 840, which may control the data processing operations, such as a program operation, an erase operation, and a read operation, of the semiconductor memory device 850, may be implemented as a part of the processor 810 or as a separate chip.

Figure 12:
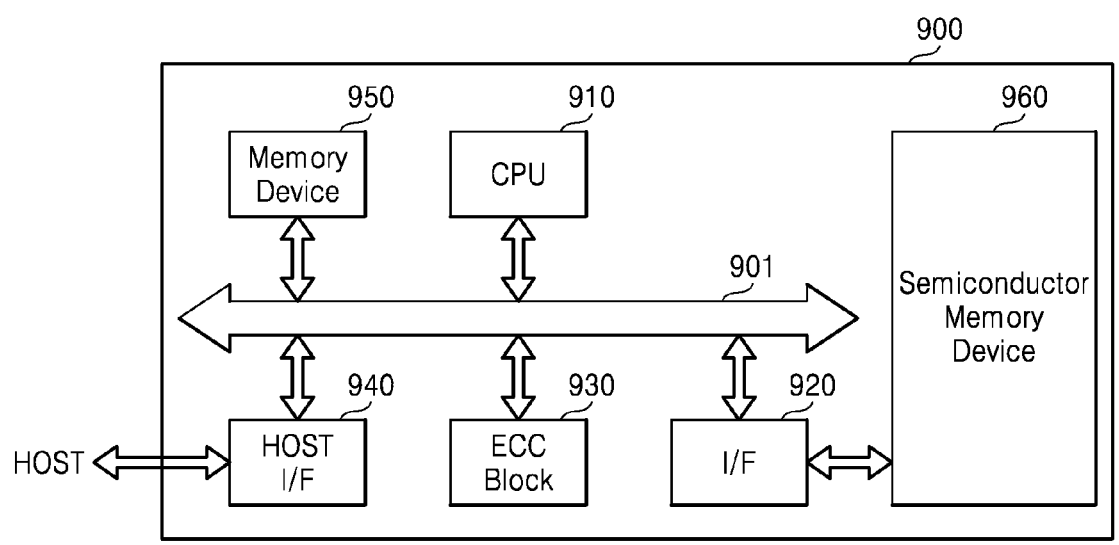
FIG. 12 is a block diagram of a semiconductor system including the MPG illustrated in FIG. 1 according to yet other embodiments

FIG. 12 is a block diagram of a semiconductor system 900 including the MPG 100 illustrated in FIG. 1 according to yet other embodiments. Referring to FIGS. 1 and 12, the semiconductor system 900 includes the MPG 100, a central processing unit (CPU) 910, an interface 920, an error correction code (ECC) block 930, a host interface 940, a memory device 950 and a semiconductor memory device 960.

The MPG 100 may output the phase output signal Pout having a different phase in response to the phase control signal Pin. The MPG 100 may be implemented in the inside or outside of each of the CPU 910, the interface 920, the ECC block 930, the host interface 940, the memory device 950, and the semiconductor memory device 960.

The memory device 950 may be used an operation memory of the CPU 910. The memory device 950 may be implemented by a non-volatile memory like read-only memory (ROM) or a volatile memory like static random access memory (SRAM). A host connected with the semiconductor system 900 may perform data communication with the semiconductor memory device 960 through the interface 920 and the host interface 940.

The ECC block 930 is controlled by the CPU 910 to detect an error bit included in data output from the semiconductor memory device 960 through the interface 920, correct the error bit, and transmit the error-corrected data to the host through the host interface 940. The CPU 910 may control data communication among the interface 920, the ECC block 930, the host interface 940, and the memory device 950 through a bus 901. The semiconductor system 900 may be implemented as a flash memory drive, a USB memory drive, an IC-USB memory drive, or a memory stick.

As described above, according to some embodiments, an MPG is allowed to generate a signal having a wanted phase by adjusting current supplied to a buffer. According to other embodiments, an MPG is allowed to generate a signal having a wanted phase by adjusting the number of capacitors connected to an output terminal of a buffer. According to further embodiments, an MPG is allowed to generate a signal having a wanted phase by adjusting the number of buffers included in a buffer unit.

While the exemplary embodiments have been particularly shown and described, it will be understood by those of ordinary skill in the art that various changes in forms and details may be made therein without departing from the spirit and scope of the exemplary embodiments as defined by the following claims.

What is claimed is:

1. A multi-phase generator comprising:
an oscillator unit comprising a plurality of first buffer units forming a single closed loop;
a first current source configured to supply a first current to the first buffer units;
a delay unit comprising a plurality of second buffer units respectively connected to a plurality of nodes; and
a second current source configured to supply a second current to the second buffer units,
wherein each of the plurality of nodes is connected between two adjacent first buffer units of the first buffer units, and
wherein a phase of an output signal of a second buffer unit, among the second buffer units, lags behind a phase of an output signal of a first buffer unit, among the first buffer units.

2. The multi-phase generator of claim 1, wherein a phase of an output signal of the second buffer units is determined by the first current and the second current.

3. The multi-phase generator of claim 2, wherein the first current is larger than the second current.

4. The multi-phase generator of claim 1, wherein each of the first buffer units comprises a plurality of P buffers connected in parallel and a phase of an output signal of each of the first buffer units is determined by P, where P is an integer of at least 2, and
wherein each of the second buffer units comprises a plurality of K buffers connected in parallel and a phase of an output signal of each of the second buffer units is determined by K, where K is an integer of at least 2.

5. The multi-phase generator of claim 4, wherein P is greater than K.

6. The multi-phase generator of claim 1, further comprising:
a plurality of first capacitor units respectively connected to the nodes; and
a plurality of second capacitor units respectively connected to output nodes of the second buffer units.

7. The multi-phase generator of claim 6, wherein each of the first capacitor units comprises a plurality of M capacitors and a phase of an output signal of each of the first buffer units is determined by M, where M is an integer of at least 2, and
wherein each of the second capacitor units comprises a plurality of L capacitors and a phase of an output signal of each of the second buffer units is determined by L, where L is an integer of at least 2.

8. The multi-phase generator of claim 7, wherein M is smaller than L.

9. A multi-phase generator comprising:
a first buffer unit configured to be connected to a first node and output a first signal by delaying an input signal of the first node;
a first current source configured to supply a first current to the first buffer unit and the second buffer unit;
a second buffer unit configured to be connected to the first buffer unit and output a second signal by delaying the first signal;
a third buffer unit configured to be connected to the first node and to output a third signal by delaying the input signal; and
a second current source configured to supply a second current to the third buffer unit,
wherein a phase of the third signal has a value between a phase of the first signal and a phase of the second signal.

10. The multi-phase generator of claim 9, wherein the phase of the third signal is determined by the first current and the second current.

11. The multi-phase generator of claim 9, wherein each of the first and second buffer units comprises a plurality of P buffers connected in parallel and the phase of the second signal is determined by P, where P is an integer of at least 2, and wherein the third buffer unit comprises a plurality of K buffers connected in parallel and the phase of the third signal is determined by K, where K is an integer of at least 2.

12. The multi-phase generator of claim 9, further comprising:

a first capacitor unit connected to the first node; and a second capacitor unit connected to an output node of the third buffer unit.

13. The multi-phase generator of claim 9, wherein the first capacitor unit comprises a plurality of M capacitors and the phase of the second signal is determined by M, where M is an integer of at least 2, and wherein the second capacitor unit comprises a plurality of L capacitors and the phase of the third signal is determined by L, where L is an integer of at least 2.

14. A method of a multi-phase generator, the method comprising:

generating a first current in response to a current control voltage signal;

generating a second current in response to the current control voltage signal;

supplying the first current to a plurality of first buffer units;

supplying the second current to a plurality of second buffer units;

delaying an input signal by an amount corresponding to the first current and outputting a corresponding intermediate phase signal in each of the first buffer units; and delaying the corresponding intermediate phase signal from each of the first buffer units by an amount corresponding to the second current and outputting a corresponding phase output signal in each of the second buffer units.

15. The method of claim 14, wherein the first buffer units form a single closed loop and the second buffer units are connected to a corresponding plurality of nodes.

16. The method of claim 15, wherein each of the corresponding plurality of nodes is connected between two adjacent first buffer units of the first buffer units.

17. The method of claim 14, wherein the corresponding phase output signal of each of the second buffer units lags behind the corresponding intermediate phase signal of the first buffer units.

18. The method of claim 14, wherein the first current is larger than the second current.

* * * * *